United States Patent [19]
Gipstein et al.

[11] 3,898,350
[45] Aug. 5, 1975

[54] TERPOLYMERS FOR ELECTRON BEAM POSITIVE RESISTS

[75] Inventors: Edward Gipstein; William Ainslie Hewett, both of Saratoga, Calif.

[73] Assignee: International Business Machines Corporation, Armonk, N.Y.

[22] Filed: June 27, 1974

[21] Appl. No.: 483,589

[52] U.S. Cl. .................... 427/43; 96/35.1; 96/36.2; 204/159.22; 260/79.3 A; 427/273
[51] Int. Cl.[2] ........................................... B05D 3/06
[58] Field of Search ......... 117/93.31, 8; 427/43, 44; 96/35.1, 36.2, 115 P; 204/159.22; 260/79.3 A

[56] References Cited

UNITED STATES PATENTS 3,535,137 10/1970 Haller et al. .................... 117/93.31
3,585,118 6/1971 Harada et al. .................. 117/93.31

OTHER PUBLICATIONS

Brown et al., "Macromolecules," Vol. 5, No. 2, March–April, 1972, pp. 109–114.

*Primary Examiner*—J. H. Newsome
*Attorney, Agent, or Firm*—Joseph G. Walsh

[57] ABSTRACT

Electron beam positive resists are formed from terpolymers of (a) an alpha olefin, (b) sulfur dioxide, and (c) a compound selected from the group consisting of cyclopentene, bicycloheptene and methyl methacrylate. The terpolymers have the particular unexpected advantage of being resistant to cracking of the films.

7 Claims, No Drawings

TERPOLYMERS FOR ELECTRON BEAM POSITIVE RESISTS

FIELD OF THE INVENTION

The present invention is concerned with a process for preparing electron beam positive resists. By the use of certain specified terpolymers there are obtained resists which are particularly resistant to cracking and crazing of the films.

PRIOR ART

Positive acting polymeric electron beam resists are well known in the prior art. Such prior art is thoroughly discussed in, for example, U.S. Pat. No. 3,535,137 of Haller et al. That patent provides a very good discussion of typical methods for fabricating and using resist materials. As is explained in that patent, the process typically starts by dissolving a suitable polymer in a solvent. A thin polymer film is then formed on a substrate by a process such as, for example, spinning a drop of the dissolved polymer on the substrate surface and allowing it to dry. The polymer film may then be baked to improve the adhesion and handling characteristics of the film. The next step involves exposing selected portions of the polymer film to electron beam radiation, in the range of 5 to 30 kilovolts. This radiation causes scission of the bonds of the polymer. As a result of such scissions, the portions of the polymer film which have been exposed to the radiation may be selectively removed by application of a developer solvent while leaving the unexposed portion of the film still adhered to the substrate. When it is so desired, the remaining polymer film may be baked to eliminate undercutting. Following this, in cases where it is so desired, the exposed underlying substrate may be etched with a suitable etchant.

Typical solvents and developers suitable for use in the present invention include aromatic solvents such as m-xylene, chlorinated solvents such as carbon tetrachloride, esters such as methyl acetate, ethers such as tetrahydrofuran, ketones such as methyl isobutyl ketone, and hydrocarbons such as cyclopentane. Mixtures of solvents are also useful, with the optimum one depending upon the particular polymer being used.

Prior art materials which have been particularly successful as positive acting electron beam resists include poly (methyl methacrylate) and certain poly (olefin sulfones). There are, however, relatively few materials which simultaneously possess all of the required properties to act as resists. It is necessary that the material be chemically resistant to etching solutions but still degrade under electron radiation. The material must be capable of adhering to the substrate as a film, and the film must resist cracking. In particular, poly (olefin sulfones) have in the past been found to give brittle films. It has been observed that films of, for example, poly (cyclopentene sulfone) or poly (bicycloheptene sulfone) when spun to a thickness greater than 3,000 A craze or crack. In the past, various methods of attempting to improve the film forming properties have been unsuccessfully tried. For example, when low molecular weight sulfones were added as plasticizers, these materials caused the films to become cloudy after spinning or else they precipitated out during the prebake step. When low molecular weight polymer fractions were used, cracking was diminished but the electron sensitivity was reduced.

SUMMARY OF THE INVENTION

It has now been found that crack and craze resistant films suitable for use in positive acting electron beam processes may be prepared by the use of certain terpolymers. As far as we are aware, the present application represents the first use of terpolymers in electron beam resist technology.

The terpolymers suitable for use in the present invention are those formed from (a) alpha olefin, (b) sulfur dioxide, and (c) a compound selected from the group consisting of cyclopentene, bicycloheptene and methyl methacrylate. When these terpolymers are used as electron beam resists, sensitive but toughly adherent and crack resistant films are obtained.

The following Examples are given solely for the purpose of illustration and are not to be deemed limitations of the present invention many variations of which are possible without departing from the spirit or scope thereof.

EXAMPLE 1

Synthesis of Polysulfone Terpolymers

When two olefins can each copolymerize with $SO_2$ in a 1:1 ratio, the three component system also behaves as a 1:1 ratio (total vinyl monomers:$SO_2$).

Poly(cyclopentene sulfone-co-hexene-1-sulfone)

A mixture of 13.6 g (0.2 mole) cyclopentene, 33.6 g (0.3 mole) hexene-1 and 0.36 g ($4\times10^{-3}$ mole) t-BHPO (t-butyl hydro peroxide) initiator dissolved in 250 ml dry toluene was polymerized at −20°C with 48 g of $SO_2$ (0.75 mole) added dropwise to the stirred solution. After 1 hr. the viscous solution was poured into 2 liters of cold MeOH to precipitate a white polymer. The polymer was purified by dissolution in $CHCl_3$ and reprecipitation in MeOH. After drying 48 hr. at 45° under vacuum 56.7 g (100%) of product was obtained.

The terpolymer was characterized by several analytical methods:

1. Elemental Analysis for $+C_{11}H_{20}S_2O_4+_n$:

| | Theory for Terpolymer | Found | |
|---|---|---|---|
| C | 47.12 | 47.13, | 47.21 |
| H | 7.19 | 7.37, | 7.20 |
| S | 22.87 | 23.08, | 22.85 |
| O | 22.82 | 22.65, | 22.85 |

2. Gel Permeation Chromatography (GPC)

A monomodal distribution curve was obtained of the polymer in $CHCl_3$ solvent from which the following molecular weight averages (compared to polystyrene standards) were calculated by a computer programmed analysis.

| $\overline{M}_w$ | $\overline{M}_n$ | $\overline{M}_w/\overline{M}_n$ |
|---|---|---|
| 339,191 | 171,647 | 1.98 |

3. Pyrolytic Gas Chromatography and Mass Spectrometry

A combination of these two techniques established from the products obtained that the polymer was an alternating 1:1:2 (olefins:$SO_2$) terpolymer.

4. TGA measurements compared the terpolymer with the respective copolymers. The terpolymer decomposed very much like the hexene-1-polysulfone copolymer but with about twice as much weight loss in the first step as the copolymer (decomposition began at 102°C). TMA measurements indicated that the $T_c$° had been lowered to 59°–62° ($T_c$° of PCPS is ~98°C; $T_c$° hexene-1-polysulfone is ~58°C).

5. The NMR spectrum also indicated that the reactants had combined in a 1:1:2 ratio (olefins:$SO_2$).

The terpolymer was heated 3 hr. at 100°C in vacuum to lose 2.6% of its original weight with a small change in the molecular weight: $\overline{M}_w$ 330,425, $\overline{M}_n$ 159,942, $\overline{M}_w/\overline{M}_n$ 2.07.

Exposure of the terpolymer to 3 Mrads of gamma radiation reduced the molecular weight:

| $\overline{M}_w$ | $\overline{M}_n$ | $\overline{M}_w/\overline{M}_n$ |
|---|---|---|
| 63,113 | 30,642 | 2.05 |

The solubility of the terpolymer was enhanced over that of the individual copolymers so that films could be spun from a larger number of solvents.

EXAMPLE 2

Poly(Bicycloheptene sulfone-co-hexene-1-sulfone)

A mixture of 18.8 g (0.2 mole) bicycloheptene, 33.6 g (0.4 mole) hexene-1and 0.36 g t-BHPO initiator dissolved in 350 ml cyclohexanone was polymerized at –20°C with $SO_2$, 48 g (0.75 mole). The polymer was recovered from MeOH and purified from $CHCl_3$/MeOH to give 48 g (78.3%) white polymer. Elemental Analysis for $(C_{13}H_{22}S_2O_4)_n$:

| | Theory for 1/1/2 Terpolymer | Found | |
|---|---|---|---|
| C | 50.95 | 51.39, | 51.39 |
| H | 7.24 | 7.19, | 7.10 |
| S | 20.93 | 20.87, | 21.14 |
| O | 20.88 | 20.44, | 20.38 |

The GPC curve was monomodal: $\overline{M}_w$ 90,879, $\overline{M}_n$ 37,597, $\overline{M}_w/\overline{M}_n$ 2.77.

Pyrolysis gas chromatography combined with mass spectrometry confirmed the terpolymer structure.

TMA measurements gave a $T_c$° of 64°–68°C which is lower than the $T_c$° of 83°–88°C obtained for the PBCHS copolymer.

Polymer films spun from 7–10% 1,5-dichloropentane solutions gave excellent crack-free films on $SiO_2$ substrates. The adhesion of these films to the substrate was good.

EXAMPLES 3–17

The terpolysulfones listed in Tables I and II were prepared by the techniques described in the previous two Examples. Table I contains terpolymers of cyclopentene sulfone and Table II contains bicycloheptene sulfone terpolymers. The terpolymers prepared in Table III were block polymers of methyl methacrylate, olefin and $SO_2$. These polymers were prepared in a sealed parr reactor by heating the monomers at least 24 hr. at 50 ± 2°C with a free radical initiator. The polymers were purified by repeated precipitation from chloroform solvent into methyl alcohol or petroleum ether, a non-solvent.

Polycyclopentene sulfone films greater than 4000 A were observed to crack during the prebake step or during development. Cyclopentene/butene-1-$SO_2$ films 4000 to 9100 A thick did not crack or craze and could be successfully processed to give excellent images after exposure. For example, 6000 to 9000 A thick films were spun from 7–10% solutions of the polymer in $CH_3NO_2$ on $SiO_2$ wafers precoated with BSA (bis trimethylsilyl acetamide), an adhesion promoter, was prebaked for 1 hr. at 100°C under vacuum. A pattern was written with an E-beam at 110 N sec. exposure ($4\times10^{-6}$ coul/cm$^2$) and images developed with a solvent mixture of cycloheptanone and cyclohexanone (80/20). The developed wafer was post-baked at 165°–200°C for 30 minutes to 1 hr. and then etched with HF for 5 minutes. Excellent images of high definition and fidelity with fine line geometry remained.

TABLE I

| Example | Poly(Cyclopentene Sulfone) Terpolymers Olefin | $\overline{M}_w$ | $\overline{M}_n$ | $\overline{M}_w/\overline{M}_n$ | $T_c$ |
|---|---|---|---|---|---|
| 3 | Hexene-1 | 339,200 | 171,650 | 1.98 | 64–68°C |
| 4 | Butene-1 | 3,161,222 | 243,481 | 12.9 | 74°C |
| 5 | Cis-2-Butene | 408,800 | 109,600 | 3.72 | 70°C |
| 6 | Trans-2-Butene | 653,146 | 108,687 | 5.98 | 85°C |
| 7 | Cis-trans-2-Butene | 271,000 | 88,000 | 3.06 | 78°C |

TABLE II

| Example | Poly(Bicycloheptene Sulfone) Terpolymers Olefin | $\overline{M}_w$ | $\overline{M}_n$ | $_w/\overline{M}_n$ | $T_c$ |
|---|---|---|---|---|---|
| 8 | Hexene-1 | 91,000 | 32,600 | 2.77 | 64–68°C |
| 9 | Octadecene-1 | 680,100 | 52,000 | 13.1 | 80°C |
| 10 | Ethylene | 145,700 | 28,750 | 5.03 | 74–82°C |
| 11 | Cis-2-Butene | 444,270 | 174,540 | 2.55 | 65°,135°C |
| 12 | Butene-1 | 194,416 | 59,912 | 3.23 | |

TABLE III

Methyl Methacrylate/Olefin/$SO_2$ Block Terpolymers

| Example | Monomers, GM. | Catalyst, GM. | Conversion, % | Structure*, | Mole % | $\overline{M}_w$ | $\overline{M}_n$ | $\overline{M}_w/\overline{M}_n$ |
|---|---|---|---|---|---|---|---|---|
| 13 | MMA, 10.1 | AIBN, 0.3 | 37 | (MMA) | 42 | 119K | 45K | 2.61 |
| | Styrene, 10.4 | | | (Styrene) | 48 | | | |
| | $SO_2$, 45psig | | | ($SO_2$) | 10 | | | |
| 14 | MMA, 9.4 | AIBN, 0.06 | 33 | (MMA) | 88 | 116K | 51K | 2.27 |
| | Hexene-1, 6.7 | | | (Hexene-1) | 7 | | | |
| | $SO_2$ 45psig | | | ($SO_2$) | 5 | | | |
| 15 | MMA, 10 | AIBN, 0.07 | 65 | (MMA) | 42 | 229K | 40K | 5.63 |
| | BCH, 9.5 | | | (BCH) | 29 | | | |
| | $SO_2$45psig | | | ($SO_2$) | 29 | | | |
| 16 | MMA, 9.4 | AIBN, 0.07 | 14 | (MMA) | 98 | 268K | 107K | 2.50 |
| | Butene-2(C.T),9.8 | | | (Butene-2) | 1 | | | |
| | $SO_2$, 45 psig | | | ($SO_2$) | 1 | | | |
| 17 | MMA, 9.4 | AIBN, 0.07 | 55 | (MMA) | 50 | 80.5K | 42.5K | 1.89 |
| | Butene-1, 5.6 | | | (Butene-1) | 25 | | | |
| | $SO_2$, 45psig | | | ($SO_2$) | 25 | | | |

*From S,O Analyses

What is claimed is:

1. A process for forming an electron beam positive resist comprising the steps of forming on a substrate a terpolymer film of (a) from 1 to 48 mole % of an alpha olefin, (b) from 1 to 50 mole % of sulfur dioxide, and (c) from 25 to 98 mole % of a compound selected from the group consisting of cyclopentene, bicycloheptene and methyl methacrylate, and exposing said film in a predetermined pattern to low energy electron beam radiation.

2. A process as claimed in claim 1 wherein the exposure is continued until the exposed portion of the film has been rendered soluble in a fluid which is not a solvent for the unexposed portion of the film.

3. A process as claimed in claim 1 wherein the electron beam radiation is at an energy of from about 10 to about 30 KeV.

4. A process as claimed in claim 1 wherein the exposed position of the film is removed by a solvent.

5. A process as claimed in claim 1 wherein the terpolymer is formed from hexene-1, sulfur dioxide and bicycloheptene.

6. A process as claimed in claim 1 wherein the terpolymer is formed from hexene-1, sulfur dioxide and cyclopentene.

7. A process as claimed in claim 1 wherein the terpolymer is formed from hexene-1, sulfur dioxide and methyl methacrylate.

* * * * *